United States Patent
Schmit

(10) Patent No.: US 9,943,009 B2
(45) Date of Patent: Apr. 10, 2018

(54) CURRENT SENSOR WITH COOLING

(71) Applicant: Deere & Company, Moline, IL (US)

(72) Inventor: Christopher J. Schmit, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 0 days.

(21) Appl. No.: 15/214,964

(22) Filed: Jul. 20, 2016

(65) Prior Publication Data

US 2018/0027692 A1 Jan. 25, 2018

(51) Int. Cl.
| | |
|---|---|
| *H05K 7/20* | (2006.01) |
| *G01R 15/18* | (2006.01) |
| *G01R 1/44* | (2006.01) |
| *G01R 5/22* | (2006.01) |
| *G01R 19/32* | (2006.01) |
| *G01R 21/02* | (2006.01) |
| *G01R 21/14* | (2006.01) |

(52) U.S. Cl.
CPC ......... *H05K 7/2039* (2013.01); *G01R 15/183* (2013.01)

(58) Field of Classification Search
CPC ............................ G01R 15/183; H05K 7/2039
See application file for complete search history.

(56) References Cited

U.S. PATENT DOCUMENTS

| | | | |
|---|---|---|---|
| 2004/0080308 A1* | 4/2004 | Goto ................. | G01R 19/0092 324/117 H |
| 2008/0084201 A1 | 4/2008 | Kojori | |
| 2013/0193954 A1* | 8/2013 | Nakajima ......... | G01R 19/0092 324/117 R |
| 2014/0253100 A1* | 9/2014 | Lepine .................. | G01R 19/00 324/126 |
| 2014/0253108 A1 | 9/2014 | Singh et al. | |

FOREIGN PATENT DOCUMENTS

| | | |
|---|---|---|
| EP | 2626870 A1 | 8/2013 |
| EP | 2858076 A1 | 4/2015 |

OTHER PUBLICATIONS

European Search Report issued in counterpart application No. 17175576.2 dated Oct. 27, 2017. (8 pages).

* cited by examiner

*Primary Examiner* — Patrick Assouad
*Assistant Examiner* — Haidong Zhang

(57) ABSTRACT

An electrical assembly includes a heat conducting housing. A conductor is supported by the housing and conducts electrical current. An electrical insulator member surrounds the conductor. A core surrounds the insulator member and the conductor so that current flowing through the conductor induces a magnetic field in the core. A transducer is coupled to the core for generating a signal representing current in the conductor. A thermal interface member engages the core and engages the housing. The interface member conducts or can conduct heat to the housing.

19 Claims, 8 Drawing Sheets

CURRENT SENSOR WITH COOLING

TECHNICAL FIELD

The present disclosure relates to an electrical unit with a current transducer.

BACKGROUND

In certain prior art, inverters, converters, and other devices that output regulated electrical current can include some kind of current sensor or transducer. The current sensor signal is typically fed back to a controller that changes drive signals that control the power output of the device. Commonly, such a current transducer will include some type of ferric core, shield, or concentration mechanism. In some configurations, the current transducers are coupled to the output terminals of a converter or inverter such that the current transducers can feed a signal back to the controller of the device.

For example, a current measurement device can be placed around or on the output terminals of the power device. These current measurement devices can be incorporated within the same enclosure as the rest of the inverter or converter components. Being placed within the same enclosure offers some advantages and disadvantages. One illustrative disadvantage to placing these devices within the same enclosure is the amount of heat that is accumulated or realized from all the heat sources in the device. Heat can convect into the current transducer from heat-generating components (e.g., power switching transistors) of the device, heat can be conducted into the current transducer from heat-generative components of the device, and the current transducer can be heated by energy that is coupled into the current transducer from the electro-magnetic energy within the enclosure. With the contribution all of the above thermal loading factors, thermal energy can increase to limit the operational temperature range of the device, among other things. Thus, it is desired to provide an electrical power device with a current transducer which has a cooling capability.

SUMMARY

According to an aspect of the present disclosure, an electrical assembly includes a housing and a conductor supported by the housing. The conductor conducts electrical current. A core surrounds the conductor so that current flowing through the conductor induces a magnetic field in the core. A transducer is coupled to the core for generating a signal representing current in the conductor. A thermal interface member engages the core and engages the housing. The thermal interface member conducts heat to the housing. A recess is formed in the housing, and the thermal interface member is received by the recess. The core comprises a substantially annular ring. The thermal interface member comprises a curved wall which engages a portion of the housing and which engages an outer surface of the core. An insulator member surrounding the conductor, and the core surrounds the insulator member and the conductor.

DETAILED DESCRIPTION OF THE DRAWINGS

At least one example embodiment of the subject matter of this disclosure is understood by referring to FIG. 1 through FIG. 8 of the drawings. In all of the drawings, like reference numbers indicate like elements or features.

Figure 1:
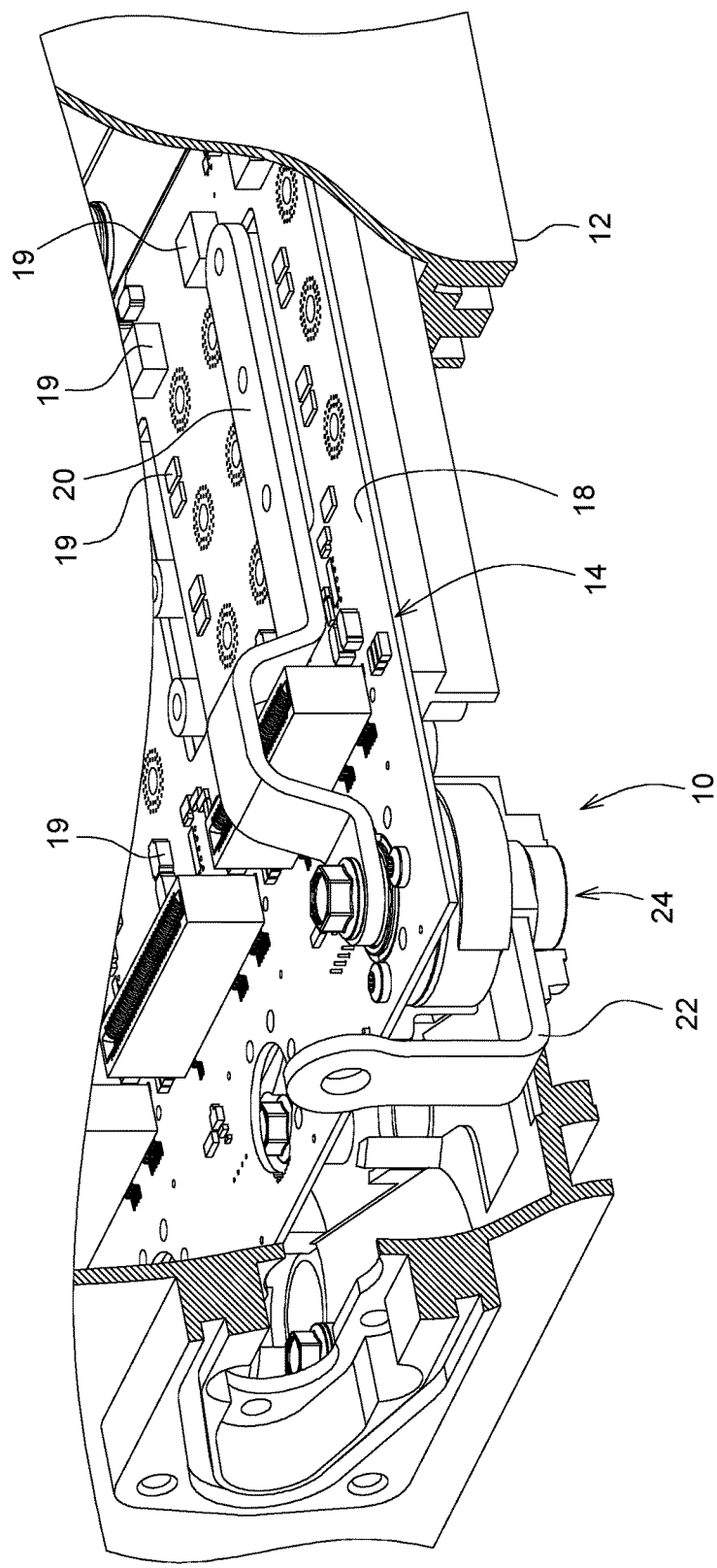
FIG. 1 is a perspective view of an electrical connection and current sensing assembly of an electronic unit with portions of the housing removed for clarity.

Referring to FIG. 1, an electrical unit 10 includes a heat-conducting housing 12 (e.g., metallic heat-conducting housing) which supports a circuit board assembly 14. The circuit board assembly 14 includes a circuit board 18 upon which a variety of electrical components 19 are mounted. For example, the electrical components 19 may comprise heat-generating electrical components, such as semiconductors, integrated circuits, resistors, inductors or capacitors. A first conductor strap 20 is mounted on one side (e.g., an upper side) of the circuit board 18. A second conductor strap 22 is mounted on the other side (e.g., a lower side) of the circuit board 18. A conductor post assembly 24 conducts current between the first conductor strap 20 and the second conductor strap 22.

Figure 2:
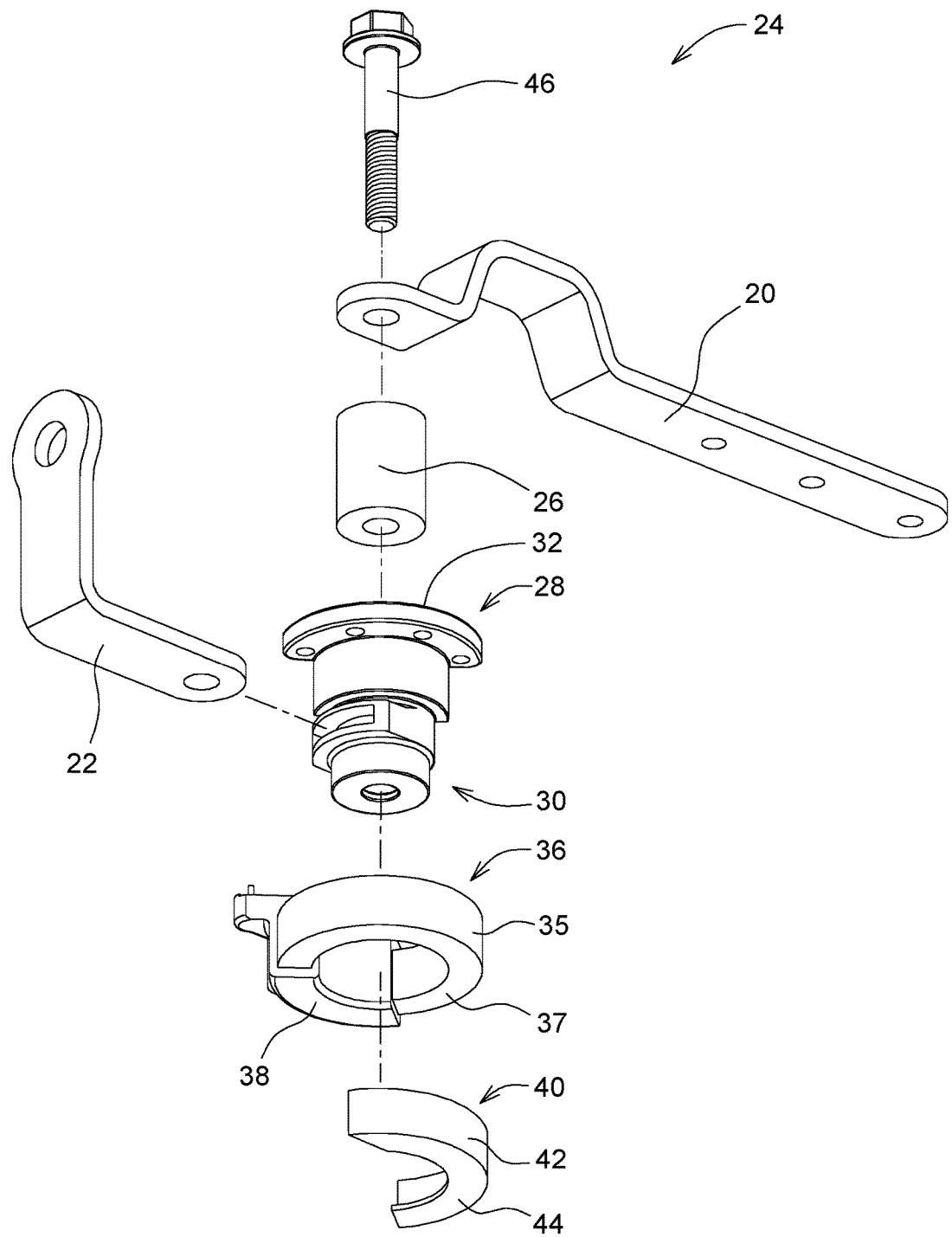
FIG. 2 is an exploded bottom perspective view of the electrical connection and current sensing assembly of FIG. 1.
Figure 3:
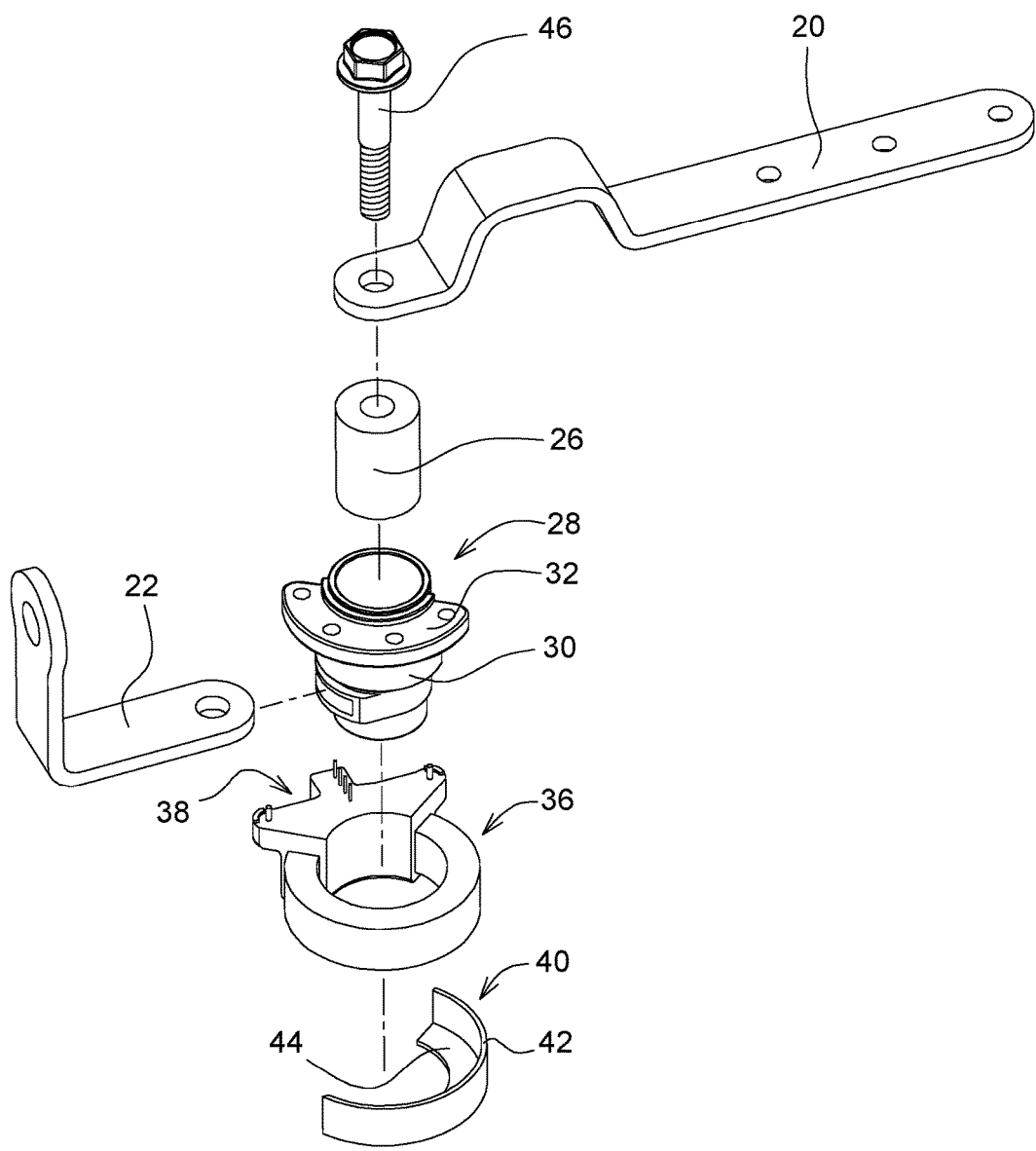
FIG. 3 is an exploded top perspective view of the electrical connection and current sensing assembly of FIG. 1.

As best seen in FIG. 2 and FIG. 3, the conductor post assembly 24 includes a sleeve or post 26, such as a hollow, substantially cylindrical conductor post. One end of the post 26 engages the first conductor strap 20, and the other end of the post 26 engages (e.g., electrically and mechanically contacts) the second conductor strap 22. The post 26 is surrounded (e.g., coaxially surrounded) by an electrical insulator support member 28. The support member 28 has a body 30 (e.g., partially cylindrical body) with a recess for receiving the post 26. Further, the support member 28 has a lip 32 or flange which engages a portion of the circuit board 18. In one embodiment, the lip 32 can be attached to a side of the circuit board 18 to secure the support member 28 to the circuit board; hence, the post 26. A current sensor includes a core 36, such as a ferric substantially annular ring, ferrite ring or an iron core, which surrounds (e.g., coaxially surrounds) or is located radially outward from the post 26 and the insulator support member 28. Current flowing through the post 26 induces a magnetic field in the core 36. A current transducer 38 surrounds a first portion (e.g., a first arc portion) of the core 36 and generates a signal representing the current flowing through the post 26.

Figure 4:
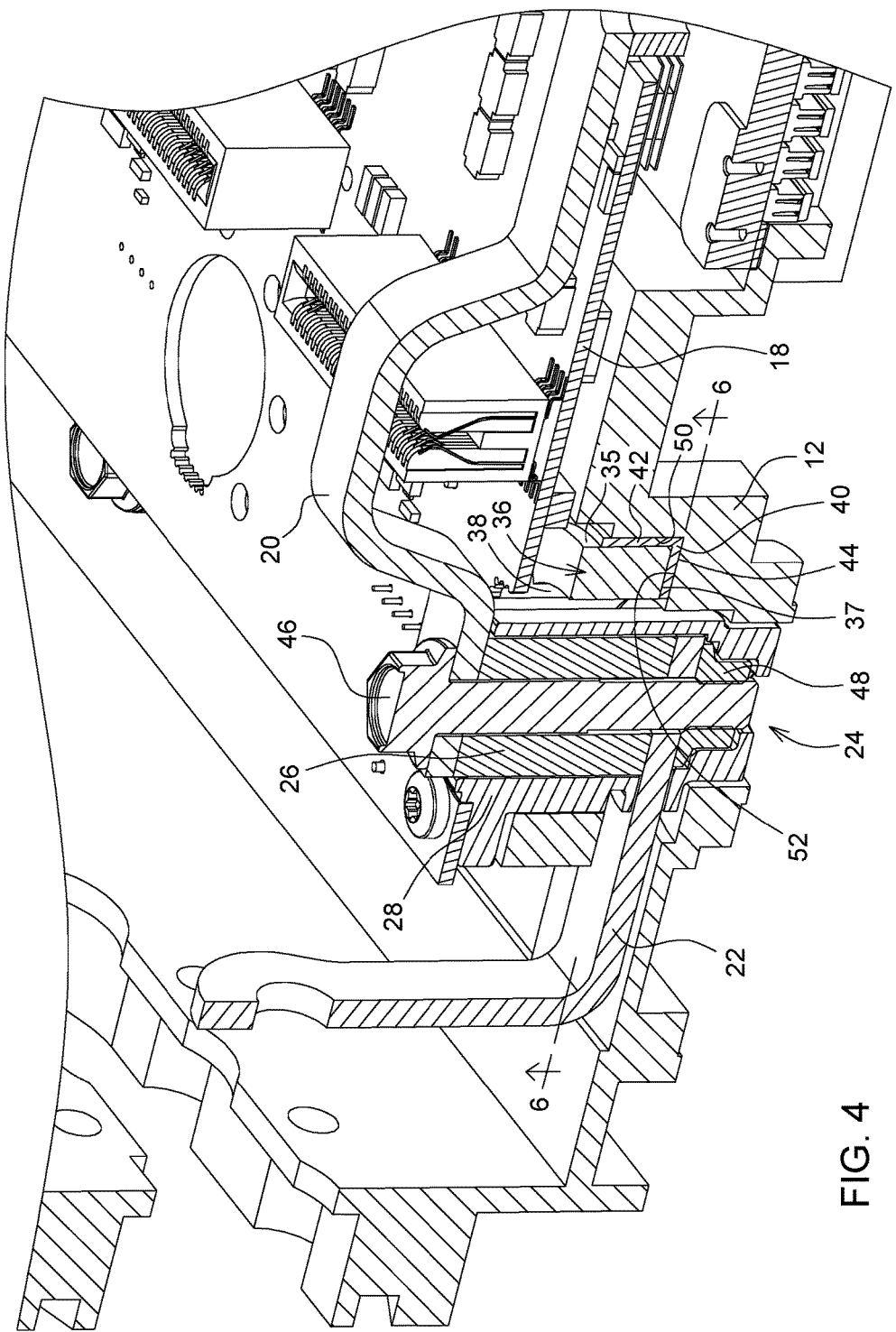
FIG. 4 is a cross-sectional, perspective view of the electrical connection and current sensing assembly of FIG. 1.
Figure 5:
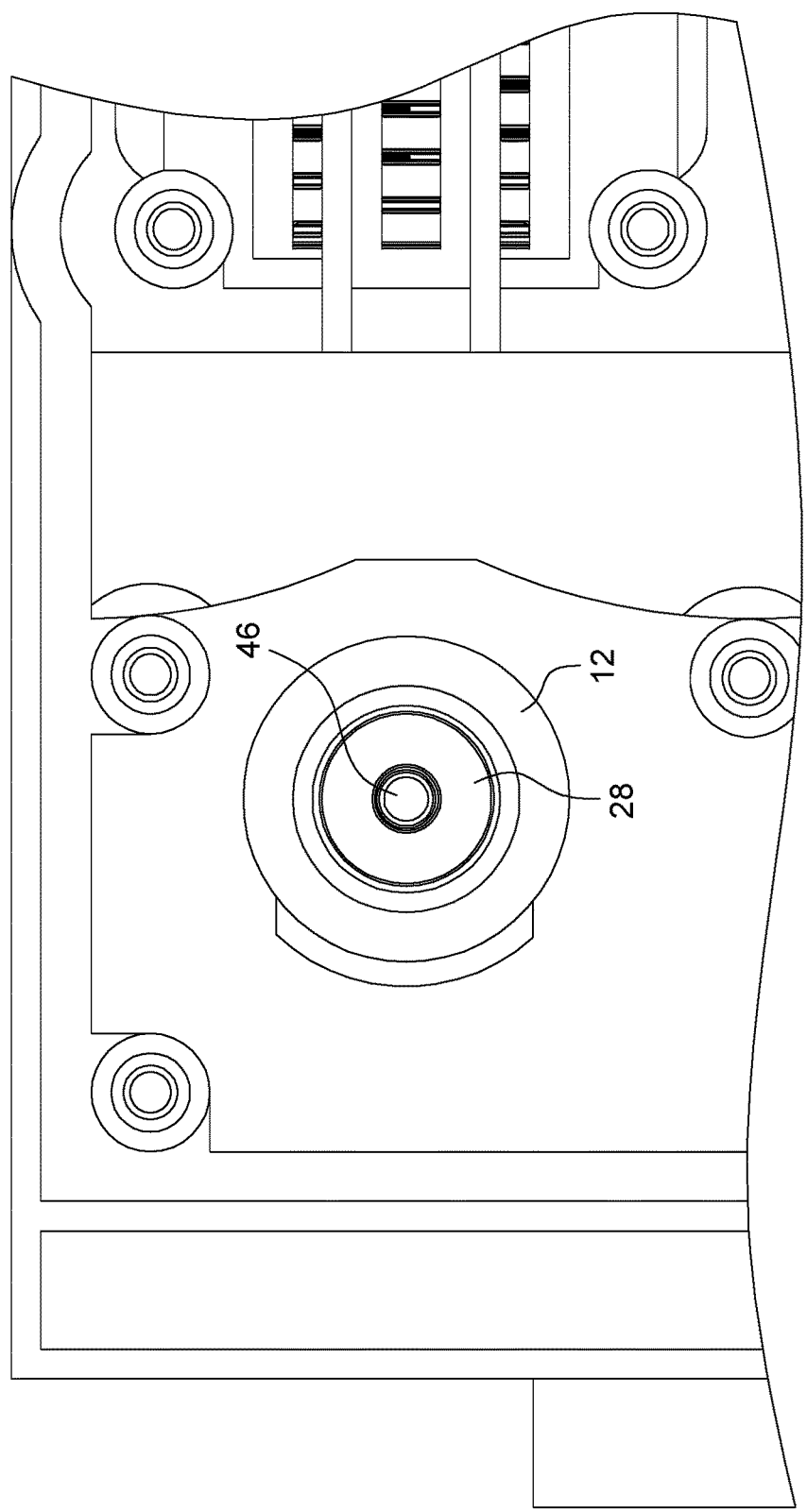
FIG. 5 is a bottom end view of the electrical connection and current sensing assembly of FIG. 1.
Figure 6:
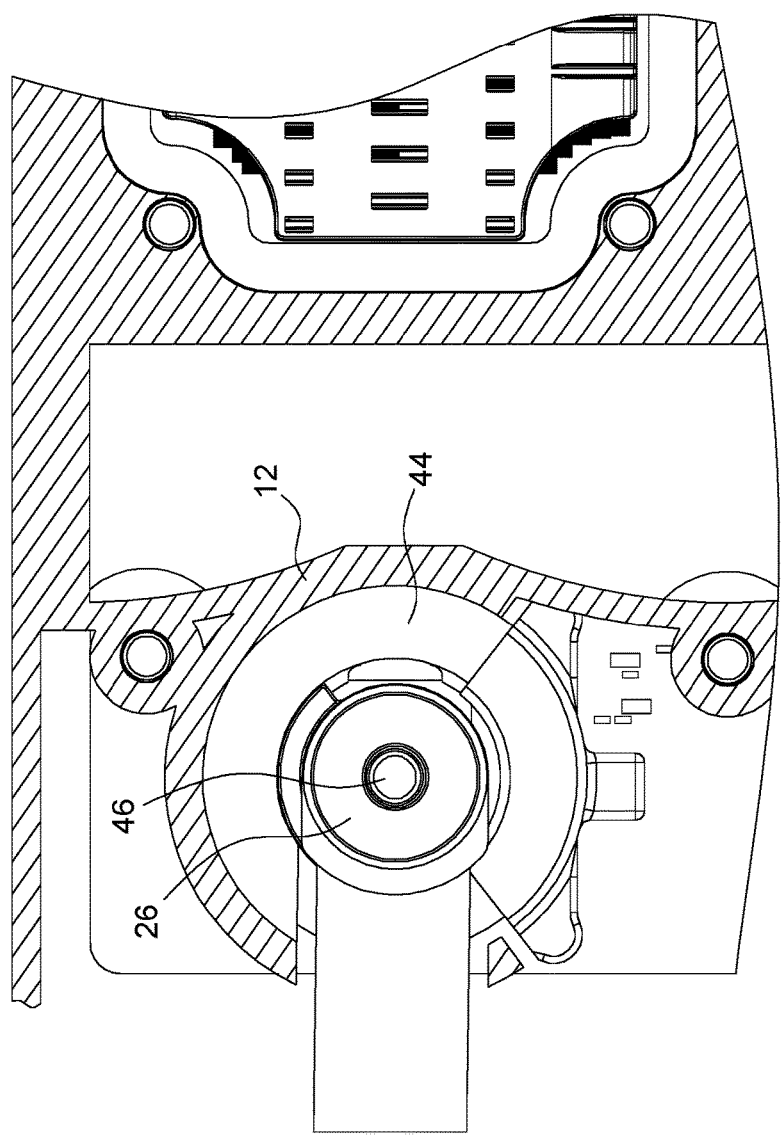
FIG. 6 is a sectional view taken along lines 6-6 of FIG. 4.

A thermal interface member 40 engages a second portion of the core 36. For example, the thermal interface member 40 may engage a second portion (e.g., second arc portion), where the second portion is distinct from or spatially separated from the first portion. In one embodiment, the interface member 40 is preferably formed out of dielectric material or other material which is electrically insulating, but which transmits or conducts heat. In one embodiment, the interface member 40 preferably includes a curved side wall 42 and a curved lip 44. As illustrated in FIG. 2 through FIG. 4, inclusive, the concave inner surface of wall 42 engages a second portion of the core 36, such as the outer peripheral surface 35 of the core 36. A surface of the lip 44 engages a portion of an end surface 37 of the core 36. As best seen in FIG. 4, the straps 20 and 22 are held in engagement with the post 26 by fasteners, such as a bolt 46 and a nut 48.

Figure 7:
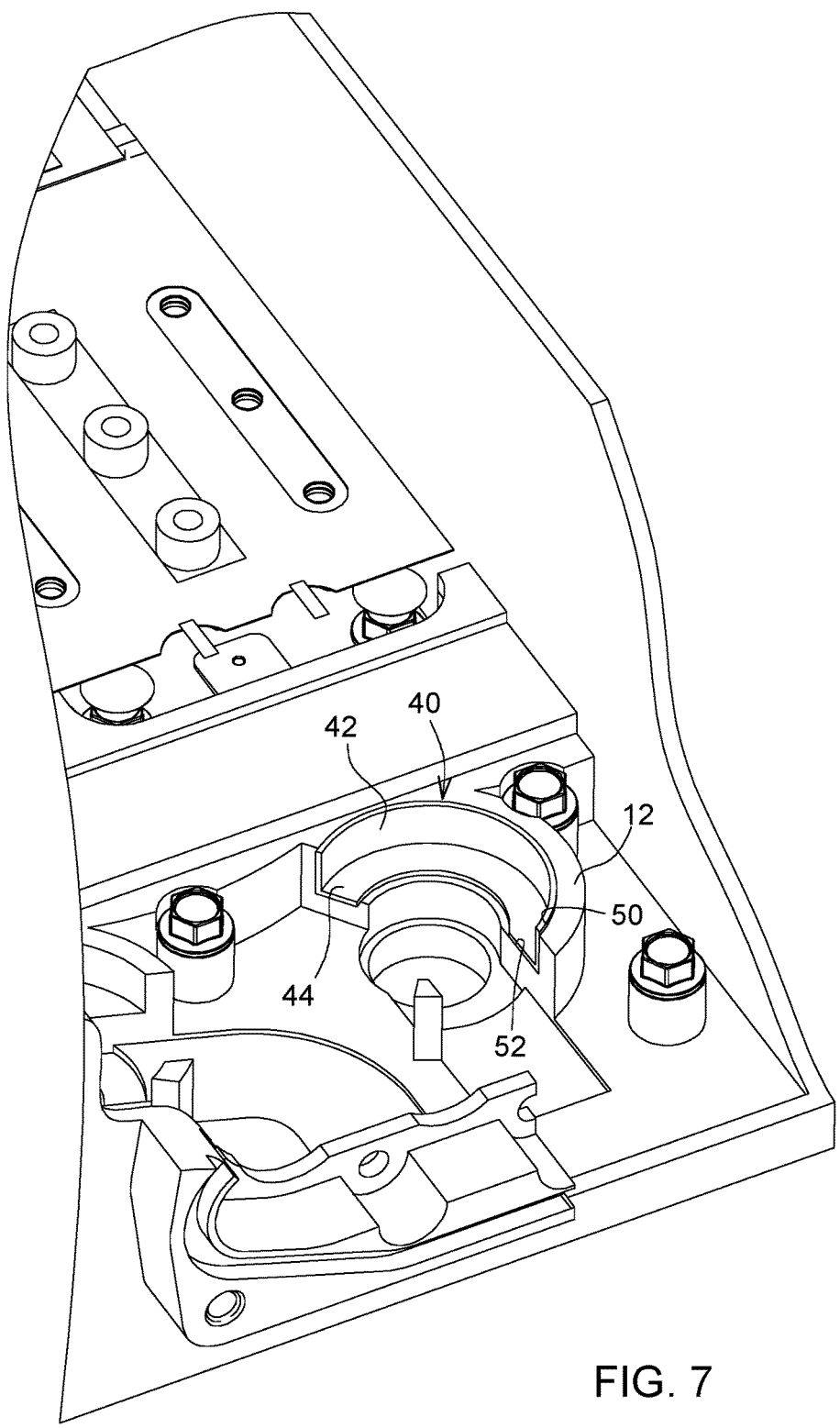
FIG. 7 is a bottom perspective view of the electrical connection and current sensing assembly of FIG. 1 with portions of the housing removed for clarity.

Referring now to FIG. 4 and FIG. 7, it can be seen that the convex outer side wall 42 of the thermal interface member 40 engages a corresponding concave wall 50 of the housing 12, and the lip 44 of the thermal interface member 40 engages a corresponding wall 52 of the housing 12. As a result, the thermal interface member 40 can electrically insulate the core 36 from the housing 12, and also can transmit heat from the core 36 to the housing 12.

Figure 8:
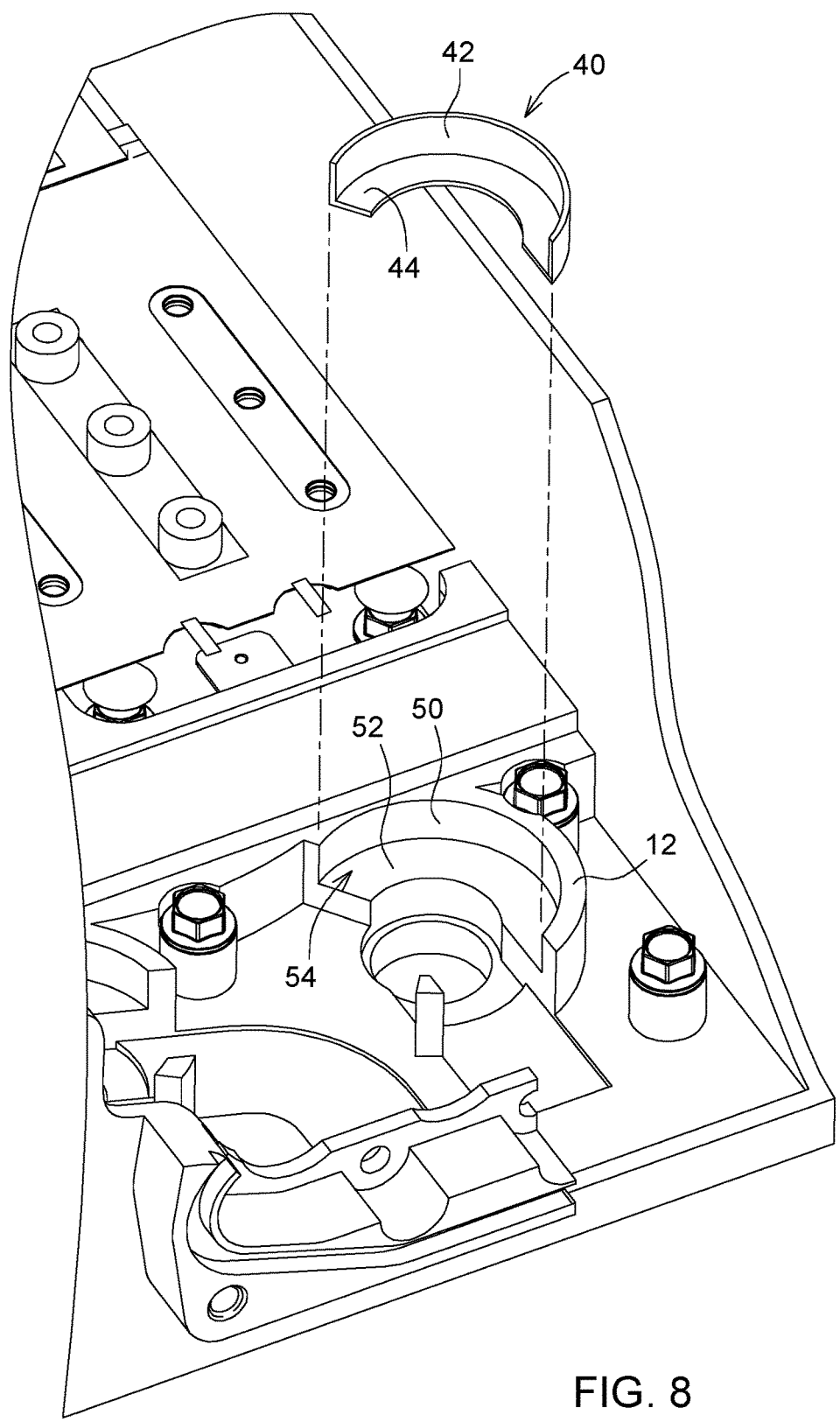
FIG. 8 is a bottom exploded perspective view of the electrical connection and current sensing assembly of FIG. 1 with portions of the housing removed for clarity.

As best seen in FIG. 7 and FIG. 8, a recess 54 is formed in the housing 12. The recess 54 (e.g., semi-cylindrical, semi-annular, or semi-elliptical recess) is surrounded by concave wall 50 and by bottom wall 52. The thermal interface member 40 is received by the recess 54.

In one configuration, the current transducer 38 exposes part or all of its core 36 to ambient air for cooling, and the core 36 has a thermal interface member 40 that comprises a thin layer of electrical isolative material or dielectric material around a portion of the core 36 for heat transfer to the housing 12. In one embodiment, a core 36 has an inner surface area thermally exposed to the support member 28 and an outer surface area adjoining or contacting the housing 12 or recess 54, alone or via the thermal interface member 40, to create a very low thermal impedance path for dissipation of heat or thermal energy to the housing 12 or its recess 54. For example, first, heat generating components on the circuit board transmit heat or thermal energy to first conductor strap 20. Second, the first conductor strap 20 transmits the heat or thermal energy to the post 26. Third, the post 26 can conduct or transmit the heat or thermal energy to the second conductor strap 22 or to the support member 28. Fourth, the support member 28 transmits or conducts the heat or thermal energy to the core 36 for dissipation to the housing via thermal interface member 40. Heat from the second conductor strap 22 may be transmitted to an external heat sink, for instance. By creating a very low thermal impedance path to the core of the current transducer, heat that is accumulated into the core can be removed. The removal of this heat then contributes to a lower temperature for the electrical device or component (integrated circuit (IC), application-specific integrated circuit (ASIC), magnetic field sensor, Hall Effect sensor or other item on the circuit board or elsewhere) that is measuring the concentrated magnetic field.

While the disclosure has been illustrated and described in detail in the drawings and foregoing description, such illustration and description is to be considered as exemplary and not restrictive in character, it being understood that illustrative embodiments have been shown and described and that all changes and modifications that come within the spirit of the disclosure are desired to be protected. It will be noted that alternative embodiments of the present disclosure may not include all of the features described yet still benefit from at least some of the advantages of such features. Those of ordinary skill in the art may readily devise their own implementations that incorporate one or more of the features of the present disclosure and fall within the spirit and scope of the present invention as defined by the appended claims.

What is claimed is:

1. An electrical assembly comprising:
   a circuit board comprising an upper side and lower side;
   a first conductor on the upper side for conducting electrical current;
   a second conductor on the lower side for conducting the electrical current;
   a conductive sleeve having one end that engages the first conductor and another end that engages the second conductor;
   an insulator member surrounding the conductor conductive sleeve;
   a core surrounding the insulator member and the conductor so that current flowing through the conductive sleeve induces a magnetic field in the core;
   a transducer coupled to the core for generating a signal representing current in the conductive sleeve;
   a thermal interface member engaging the core; and
   a housing supporting the insulator member, the housing engaging the thermal interface member so that the interface member conducts heat to the housing.

2. The electrical assembly of claim 1, wherein:
   the core comprises an annular ring; and
   the thermal interface member comprises a curved wall and a curved lip joined to an end of the curved wall.

3. The electrical assembly of claim 2, wherein:
   the curved wall has a concave surface which engages an outer surface of the core; and
   the lip engages an end of the core.

4. The electrical assembly of claim 3, wherein:
   the curved wall has a convex surface which engages a portion of the housing; and
   the lip engages the housing.

5. The electrical assembly of claim 1, wherein:
   the core comprises an annular ring; and
   the thermal interface member comprises a curved wall.

6. The electrical assembly of claim 5, wherein:
   the curved wall has a concave surface which engages an outer surface of the core.

7. The electrical assembly of claim 5, wherein:
   the curved wall has a convex surface which engages a portion of the housing.

8. The electrical assembly of claim 5, wherein:
   the thermal interface member comprises a curved lip which is joined to an end of the curved wall.

9. The electrical assembly of claim 8, wherein:
   the lip engages an end of the core, and the lip engages a portion of the housing.

10. The electrical assembly of claim 8, wherein:
    a recess is formed in the housing; and
    the thermal interface member is received by the recess.

11. The electrical assembly of claim 1, wherein:
    the transducer exposes a portion of the core for purposes of heat transfer.

12. The electrical assembly of claim 1 wherein the core comprises a ferric ring core or a ferrite ring.

13. An electrical assembly comprising:
    a circuit board comprising an upper side and a lower side;
    a first conductor strap for conducting electrical current;
    a second conductor strap on the lower side for conducting the electrical current;
    a conductive sleeve having one end that engages the first conductor strap and another end that engages the second conductor strap;
    a housing supporting the conductive sleeve;
    a core surrounding the conductive sleeve so that current flowing through the conductive sleeve induces a magnetic field in the core;

a transducer coupled to the core for generating a signal representing current in the conductive sleeve; and a thermal interface member engaging the core, the housing engaging the thermal interface member so that the interface member conducts heat to the housing.

14. The electrical assembly of claim 13, wherein:
a recess is formed in the housing; and
the thermal interface member is received by the recess.

15. The electrical assembly of claim 13, wherein:
the core comprises an annular ring; and
the thermal interface member comprises a curved wall which engages a portion of the housing and which engages an outer surf of the core.

16. The electrical assembly of claim 13, wherein:
an insulator member surrounding the conductor; and
the core surrounds the insulator member and the conductor.

17. The electrical assembly of claim 13 wherein the core comprises a ferric ring core or a ferrite ring.

18. An electrical assembly comprising:
a circuit board comprising an upper side and lower side;
a first conductor on the upper side for conducting electrical current;
a second conductor on the lower side for conducting the electrical current;
a conductive sleeve having one end that engages the first conductor and another end that engages the second conductor;
a housing supporting the conductive sleeve;
a core comprising an annular ring surrounding the conductive sleeve so that current flowing through the conductor induces a magnetic field in the core;
a transducer coupled to the core for generating a signal representing current in the conductor; and
a thermal interface member engaging the core, the thermal interface member comprises a curved wall and a curved lip joined to an end of the curved wall, and the housing engaging the thermal interface member so that the interface member conducts heat to the housing.

19. The electrical assembly of claim 18, wherein:
an insulator member surrounding the conductor; and
the core surrounds the insulator member and the conductor.

\* \* \* \* \*

UNITED STATES PATENT AND TRADEMARK OFFICE
CERTIFICATE OF CORRECTION

| | |
|---|---|
| PATENT NO. | : 9,943,009 B2 |
| APPLICATION NO. | : 15/214964 |
| DATED | : April 10, 2018 |
| INVENTOR(S) | : Christopher J. Schmit |

Page 1 of 1

It is certified that error appears in the above-identified patent and that said Letters Patent is hereby corrected as shown below:

In the Specification

At Column 1 after Line 7, insert the following:
--GOVERNMENT LICENSE RIGHTS
This invention was made with U.S. government support under contract or award No. DE-EE0006521 awarded by the Department of Energy. The Government has certain rights in the invention.--

Signed and Sealed this
Fourth Day of August, 2020

Andrei Iancu
*Director of the United States Patent and Trademark Office*